United States Patent
Tsai et al.

(10) Patent No.: US 8,053,377 B2
(45) Date of Patent: Nov. 8, 2011

(54) LOW STRESS PHOTO-SENSITIVE RESIN WITH SPONGE-LIKE STRUCTURE AND DEVICES MANUFACTURED EMPLOYING SAME

(75) Inventors: Shang-Ying Tsai, Jhongli (TW); Chun-Ren Cheng, Hsin-Chu (TW); Jiou-Kang Lee, Zhubei (TW); Jung-Huei Peng, Jhubei (TW); Ting-Hau Wu, Yilan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/892,190

(22) Filed: Sep. 28, 2010

(65) Prior Publication Data

US 2011/0081740 A1    Apr. 7, 2011

Related U.S. Application Data

(60) Provisional application No. 61/247,863, filed on Oct. 1, 2009.

(51) Int. Cl.
*H01L 21/31* (2006.01)
*H01L 21/469* (2006.01)

(52) U.S. Cl. ........ 438/780; 438/221; 438/710; 438/725; 438/781; 257/E21.587; 257/E21.632

(58) Field of Classification Search .......... 438/199, 438/200, 221, 710, 725, 780, 781; 257/E21.587, 257/E21.632
See application file for complete search history.

(56) References Cited

U.S. PATENT DOCUMENTS

| | | | |
|---|---|---|---|
| 6,287,979 B1 * | 9/2001 | Zhou et al. | 438/723 |
| 7,575,821 B2 * | 8/2009 | Wei et al. | 429/442 |
| 7,998,861 B2 * | 8/2011 | Lee et al. | 438/667 |
| 2004/0036076 A1 * | 2/2004 | Arita et al. | 257/79 |
| 2004/0187292 A1 * | 9/2004 | Miller et al. | 29/594 |
| 2009/0075361 A1 * | 3/2009 | DeLouise et al. | 435/287.9 |
| 2009/0166817 A1 * | 7/2009 | Tsai et al. | 257/642 |

* cited by examiner

*Primary Examiner* — Michelle Estrada
(74) *Attorney, Agent, or Firm* — Slater & Matsil, L.L.P.

(57) ABSTRACT

System and method for forming a structure including a MEMS device structure. In order to prevent warpage of a substrate arising from curing process for a sacrificial material (such as a photoresist), and from subsequent high temperature process steps, an improved sacrificial material comprises (i) a polymer and (ii) a foaming agent or special function group. The structure can be formed by forming a trench in a substrate and filling the trench with a sacrificial material. The sacrificial material includes (i) a polymer and (ii) a foaming agent or special function group. After further process steps are completed, the sacrificial material is removed from the trench.

19 Claims, 3 Drawing Sheets

LOW STRESS PHOTO-SENSITIVE RESIN WITH SPONGE-LIKE STRUCTURE AND DEVICES MANUFACTURED EMPLOYING SAME

This application claims the benefit of U.S. Provisional Patent Application Ser. No. 61/247,863, filed on Oct. 1, 2009, and entitled "Low Stress Photo-Sensitive Resin with Sponge-Like Structure and Devices Manufactured Employing Same," which is hereby incorporated by reference to the maximum extent allowable by law.

TECHNICAL FIELD

The present invention relates generally to a method of manufacturing a micro-electromechanical system (MEMS) device, and more particularly to a system and method for using a sacrificial sponge-like filling to prevent wafer warpage during manufacture.

BACKGROUND

MEMS devices are becoming increasingly prevalent as new and additional applications are developed employing MEMS technology. In many applications, it is important that the manufacturing processes for forming the MEMS structure be compatible with integrated circuit manufacturing processes, particularly CMOS manufacturing processes. This is particularly so as, in many applications, MEMS devices are formed simultaneously with formation of CMOS devices, or at least formed on the substrate as CMOS devices.

Frequently, it is desirable to form deep trenches within the substrate on and in which a MEMS device is formed for various applications. One such application, for instance, is an ink head printer device in which ink flows through openings formed through the substrate.

FIG. 1a illustrates a conventional ink head MEMS device 1 at an intermediate stage of manufacture. As shown, substrate 2 has formed therein deep openings or trenches 4 which allow for the passage of fluids such as printing ink. In the stage of manufacture illustrated in FIG. 1, openings 4 are blind, meaning they do not open fully through substrate 2. At a later stage of manufacture, the back side of substrate 2 will be removed, e.g., through grinding, etch-back, or like process, to the level of openings 4. Conventionally, openings 4 are filled with a sacrificial material, typically a polymer such as a conventional photoresist during subsequent manufacturing process steps.

Formed at a top surface and a top substrate 2 are various elements and features of conventional CMOS devices, including doped regions within substrate 2, polysilicon gate lines, inter-layer dielectric (ILD) layers, inter-metal dielectric (IMD) layers, conductive interconnects, passivation layers, and the like as are well known in the art of CMOS processes. As the details of the CMOS devices are not necessary to understand the described embodiments, these elements and features are collectively illustrated as CMOS device layer 6. Openings 4 extend through CMOS device layer 6 as well.

Formed a top CMOS device layer 6 is a MEMS device layer 8, both of which are shown exaggerated in the illustration of FIG. 1a. MEMS device layer 8 could include a reservoir 9, which is in communication with openings 4.

Openings 4 communicate with reservoir 9 formed a top substrate 2, as is known in the art. Conventionally, openings 4 are filled with a sacrificial material, such as photoresist material or other polymer, in order to protect openings 4 during subsequent manufacturing steps. Photoresist material such as Novalic Resin, PMMA (poly-methylmethacrylate), PBS (poly-butene-1 sulfone), poly-vinylcinnamate, polysilane, an acrylic resin, Epoxy, a precursor of polyimide, and the like are commonly used in CMOS manufacturing processes and their properties and characteristics are well understood.

Typically, photoresist material is applied to the device and allowed to fill openings 4. Once the openings are filled, the photoresist material is cured. Curing changes the material properties of photoresist material and hardens the material making it effective for protecting openings 4 during subsequent processing steps. After subsequent processing steps, photoresist material can be readily removed using, for instance, oxygen plasma, ashing, or other well known techniques.

A disadvantage of the prior art is that photoresist material shrinks during the curing process. This shrinking places significant stress on surrounding substrate 2 and can cause substrate 2 to warp, as illustrated in exaggerated form in FIG. 1b. The warpage of substrate 2 complicates subsequent steps that require a planar surface, such as photolithography steps, and can significantly impede the performance or yield of the resulting device(s). The warpage illustrated in FIG. 1b is further exacerbated by the high temperature process steps, such as chemical vapor deposition (CVD) and sputter processes which occur in the manufacture of MEMS device layer 8. These high temperature process steps impact significant thermal energy unto substrate 2, which further contributes to the problems associated with warpage.

What is needed, then, is a manufacturing process that eliminates or reduces the warpage associated with conventional manufacturing processes.

SUMMARY OF THE INVENTION

These and other problems are generally solved or circumvented, and technical advantages are generally achieved, by embodiments of the present invention.

In accordance with a preferred embodiment, a method for manufacturing a device including forming a trench in a substrate is achieved. The trench is filled with a sacrificial material comprising a polymer and a foaming agent or special function group. The method further includes performing processing steps on the device, and removing the sacrificial material from the trench.

An advantage of a preferred embodiment of the present invention is that the sacrificial material does not place strain on the device substrate during subsequent processing steps.

A further advantage of a preferred embodiment of the present invention is that the sacrificial material can be deposited, processed, and removed using conventional CMOS processing steps.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1A:
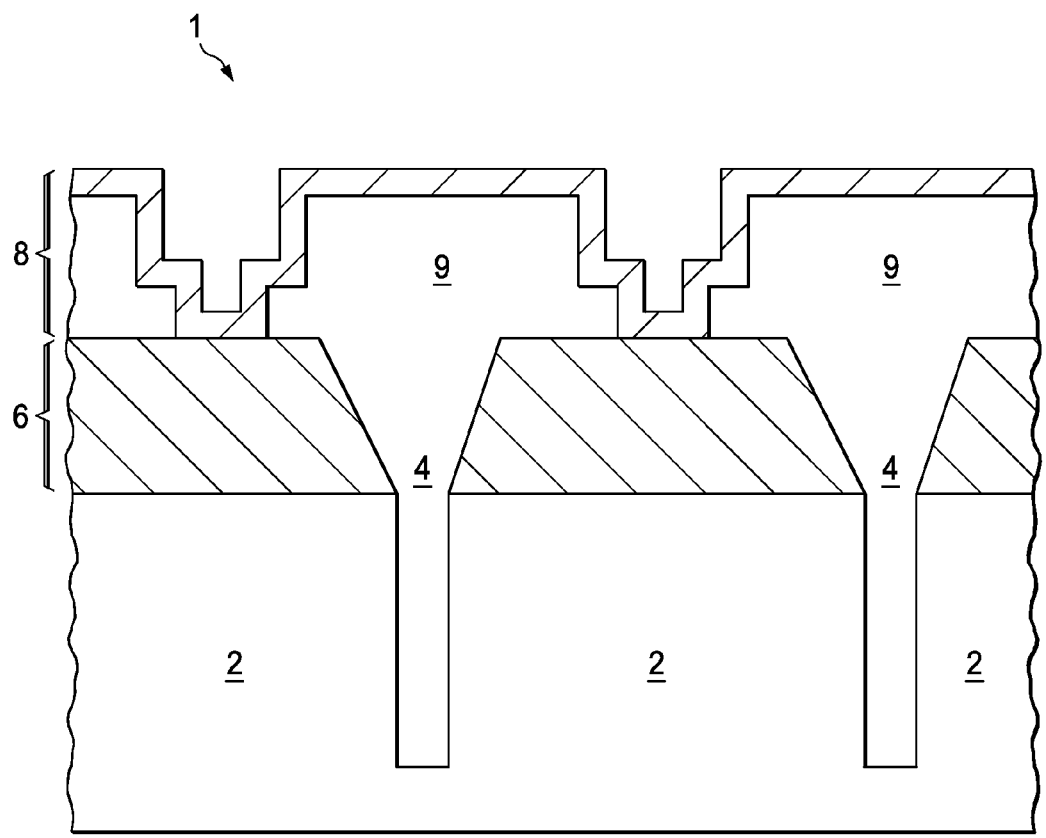
FIG. 1a illustrates in cross sectional view a MEMS device in an intermediate stage of manufacture.
Figure 1B:
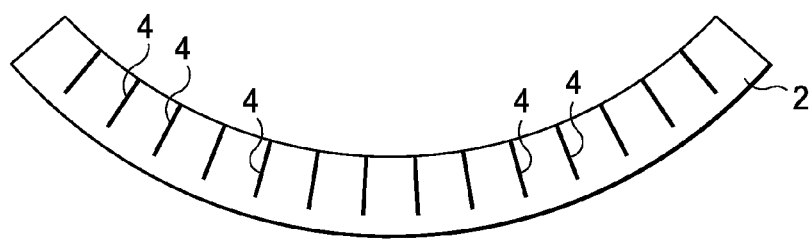
FIG. 1b illustrates warpage of a substrate resulting from strain imposed by sacrificial material within deep trenches in the substrate and high temperature manufacturing processes.
Figure 2:
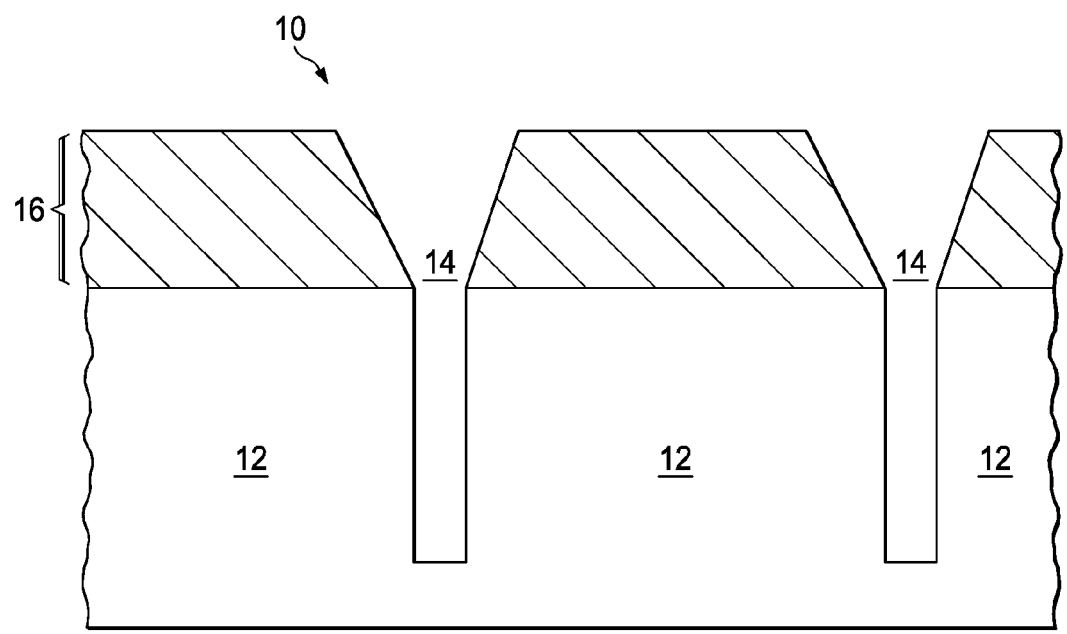
FIGS. 2 through 4 illustrate an exemplary device during intermediate stages of manufacture.

FIG. 2 illustrates an illustrative MEMS device 10 during an intermediate stage of manufacture. Layer 16 represents the various devices and layers that are formed using a conventional CMOS process. Layer 16 may include active and passive devices formed in and on the surface of substrate 12 and various wiring layers formed within dielectric layers formed above the active and passive devices, such as through use of damascene or dual damascene process, all of which are well known in the art and the details of which are omitted herein as they are not necessary for an understanding of the invention. Note that openings 14 extend from the top of layer 16 and deep within substrate 12. While not a limitation on the scope of the invention, it is believed that particularly advantageous embodiments are those wherein openings 14 are deeper than about 10 μm. As addressed above, it is desirable to fill openings 14 with a sacrificial material to protect openings 14 during subsequent processing steps.

Figure 3:
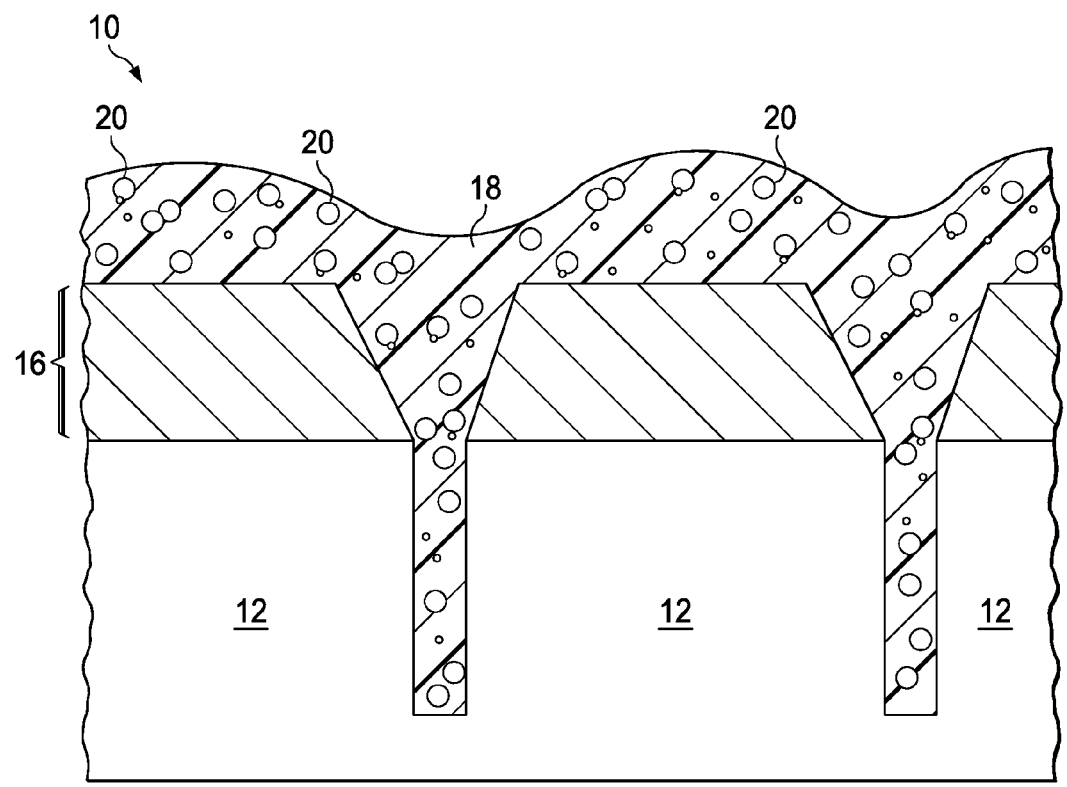

In an illustrative embodiment, openings 14 are filled with a sacrificial material 18, such as a photoresist material, that has been modified to include a forming agent or special function group, the result of which is to cause a dispersion of micro-bubbles 20 throughout the photoresist material during the deposition process, as shown in FIG. 3. While foam-forming agents are known, the application of such agents to a photoresist material are contrary to the conventional wisdom. This is because it is generally accepted in the art that photoresist material should be applied in as uniform and consistent a state as possible, without the presence of impurities, non-uniformities, or bubbles, in order to best perform its intended function.

It is believed that the foam-forming agent or special function group causes a dispersion of micro-bubbles throughout the photoresist material. During the curing process, these micro-bubbles deform and hence absorb or relieve the stress that would otherwise be caused during curing. This in turn, reduces or eliminates deformation or warpage of substrate 2 during this process.

A variety of function groups could be employed to cause the creation of micro-bubbles. Examples include but are not limited to haloalkane, Acyl halide, Aldehyde, Carbonate, Hydroperoxide, Peroxide, Amide, Primary amine, Primary ketimine, Primary aldimine, Imide, Azide, Azo, Nitrate, Nitrite, Nitro compound (Diimide), acetate or other solvents having a boiling point of above 120 C., Alcohol, Carboxylate, Carboxylic acid, Cyanate, Isocyanate, Nitroso compound, Phosphate, or other additives, including a nitroso base such as dinitrosopentamethenetetramine, a Hydrazide base such as 4-methylbenzenesulfonic acid hydrazide, an Aze base such as Azodicarboxylic acid diisopropyl ester, and the like.

A foaming material could be obtained using a commercial product, such as a compound of ADC (azodicarbonamide), DPT (Dinitroso Pentame Thylene Tetramine), or a solvent type such as Dimethyl Ether or N,N-dimethylformamide. In an embodiment, ADC and DPT can be dissolved in an organic solvent like ether, benzene and N, N-dimethylformamide or the like. Such an embodiment could include a compound mixture having a weight percentage in a range of from about 0.01% to about 2% by weight. In another embodiment a solvent type foaming agent could be employed with a weight percentage in a range of from about 0.1% to about 10%, for instance.

In one illustrative embodiment, N,N-dimethylformamide may be used as a foaming agent with I-8320 photoresister (available from Asahi Kasei EMD Corporation, Tokyo, Japan). The agent is mixed at a per weight ration of about N,N-dimethylformamide: I-8320=10 g:2 Kg. After mixing, standard I-8320 processes are followed for, e.g., filling trenches 14 (FIG. 3) with the photoresist/foaming agent mix. In an illustrative embodiment, curing is accomplished by a hard bake process of from about 200° C. to about 300° C. and for a period of from about 30 minutes to about 2 hours. It is believed that a dispersion of micro-bubbles of diameter from about 5 μm to about 80 μm will result.

In another illustrative embodiment, ADC (azodicarbonamide) of about 0.1% by weight is dissolved in benzene. TADC solution can be mixed with SU-8 2050 photoresist (available from Microchem Corp., Newton, Mass.), illustratively at a ratio of ADC solution:SU-8=2 g:2 Kg. Curing is accomplished using relatively standard process for SU-8 process, but at a hard bake temperature of from about 150° C. to about 300° C. with a heating curve/hold time of greater than 10 minutes. It is believed that a dispersion of micro-bubbles of diameter for from about (0.1 μm to about 20 μm. By varying the heating curve and hold time, bubbles of different sizes could be obtained.

In yet another illustrative embodiment, a solution of 1.1% by weight of 4,4'-Oxybis(benzenesulfonyl) hydrazide dissolved in Cyclohexanone (called herein "solution 1") could be employed for a foaming agent. The solution1 could be mixed with, e.g., a commercial photoresist such as SPR 220-7 (for example, at a ratio of about solution1: SPR 220-7= 1:>10). The mixture can be processed using normal lithography processes, and with a final baking step over 140° C. for forming and curing. It is believed that a dispersion of micro-bubbles of diameter of less than about 0.5 μm can be obtained with this process, with diameter size could be varied by varying the bake temperature and heating curve, for instances.

As illustrated above, in the illustrative embodiments, a conventional photoresist material is modified by mixing with the conventional material a foaming agent using mechanical mixing, sonic mixing, or the like. In illustrative embodiments, the solution or solvent is mixed with photoresist then the container is sealed. The container is rotated at a temperature of about 60° C. to about 80° C. for about 1 to 4 hours, after which the mixture can be used after it cools down to room temperature. This process is deemed sufficient to ensure adequate and uniform mixture of the foaming agent and the photoresist. In another illustrative embodiment, photoresist material is formed using a modified formulation such that an appropriate special function group is integrated into the polymer chain. It is believed that this special function group breaks or prevents polymer chains from forming, which will result in the formation of micro-bubbles within the material. Other polymers could be employed as sacrificial material 18 as well.

The result is sacrificial material 18 having a sponge-like structure in which micro-bubbles are dispersed throughout the photoresist material. As described above, such micro-bubbles can function to relieve stress during the curing process.

Figure 4:
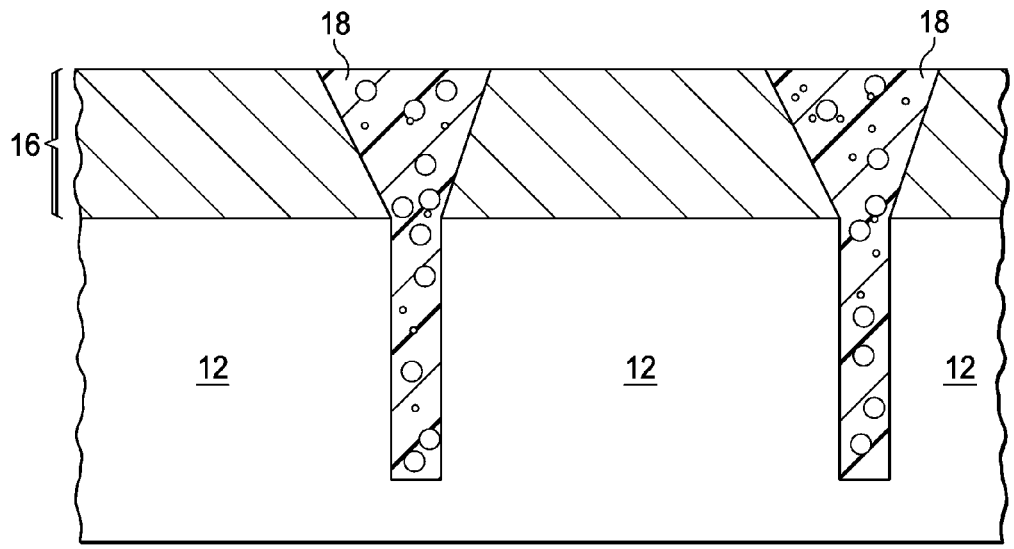

As illustrated in FIG. 4, sacrificial material 18 is next planarized to provide a planar surface for subsequent processing steps, such as the formation of MEMS devices. Sacrificial material 18 is preferably planarized using an etch back process, such as a dry etching (O2 plasma) process controlled by end-point detection or time mode. Alternatively, sacrificial material 18 could be planarized by a mechanical process, a chemical mechanical (CMP) process, covered by additional PR coating, thermal reflow, or the like.

Figure 5:
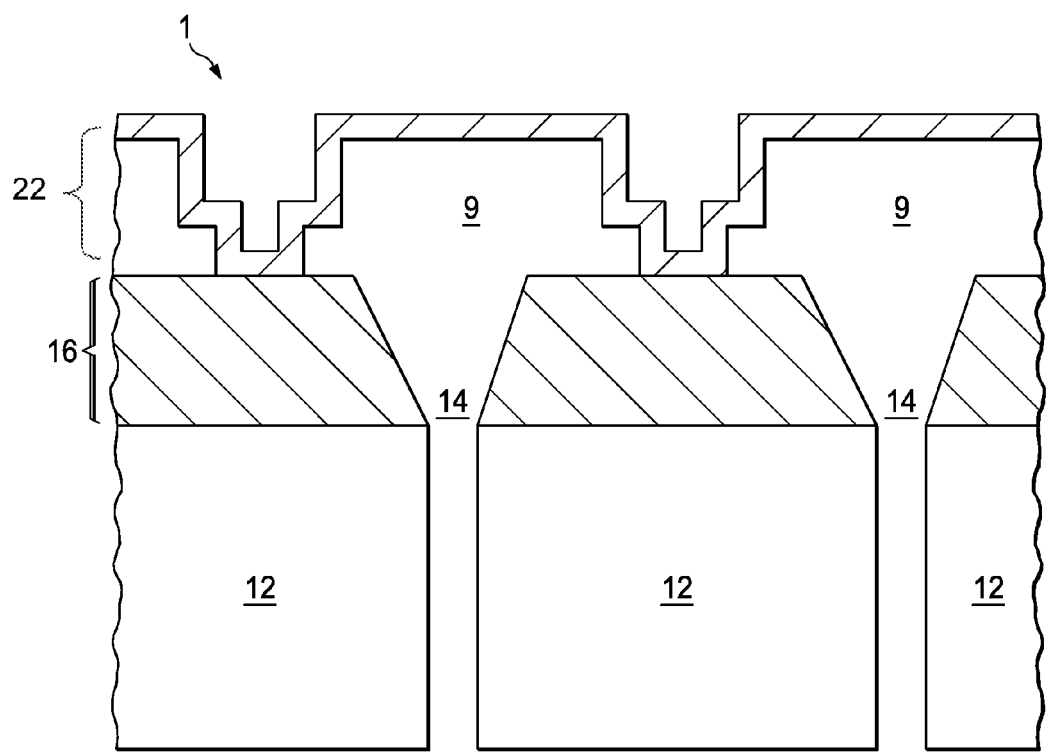
FIG. 5 illustrates in cross section an MEMS device embodiment.

After sacrificial material 18 is planarized, processing can continue with the formation of various elements of features to form MEMS device layer 22, as illustrated in FIG. 5. As also shown in FIG. 5, processing of the device further includes removing material from the back-side of substrate 12 until openings 14 are reached. Substrate 12 could be subject to a lapping step, an etch back step, a CMP step, combinations of the above, or other conventional steps in order to remove backside material. This thinning back of the backside of substrate 12 exposes sacrificial material 18 within openings 14 (which now extend completely through thinned substrate 12).

Sacrificial material 18 can be removed from openings 14, preferably through an oxygen plasma process, an oxygen ashing process, or another process that effectively removes sacrificial material without deleteriously affecting other components and layers of the device. Removal of polymers such as photoresists using oxygen plasma techniques is well known in the art, the details of which are not necessary for an understanding of the present invention. While normal process can be employed, it should be noted that the removal rate will likely be faster than conventional sacrificial materials because of the lower density of the sponge-like material of the illustrative embodiments.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a device comprising:
   forming a trench in a substrate;
   filling the trench with a sacrificial material, the sacrificial material comprising (i) a polymer and (ii) a foaming agent or special function group the sacrificial material being in the form of a polymer matrix having dispersed therein micro-bubbles at the time of the filling step;
   performing processing steps on the device; and
   removing the sacrificial material from the trench.

2. The method of claim 1 wherein the foaming agent or special function group comprises a material consisting from the group consisting essentially of haloalkane, Acyl halide, Aldehyde, Carbonate, Hydroperoxide, Peroxide, Amide, Primary amine, Primary ketimine, Primary aldimine, Imide, Azide, Azo, Nitrate, Nitrite, Nitro compound (Diimide), acetate, Alcohol, Carboxylate, Carboxylic acid, Cyanate, Isocyanate, Nitroso compound, Phosphate, and combinations thereof.

3. The method of claim 1 wherein the polymer is a photoresist material.

4. The method of claim 1 wherein performing processing steps includes curing the polymer material.

5. The method of claim 1 wherein removing the sacrificial material from the trench includes exposing the sacrificial material to an oxygen plasma.

6. The method of claim 1 wherein the micro-bubbles have a diameter in the range of from about 100 Angstroms to about 500,000 Angstroms.

7. The method of claim 1 wherein the trench is at least 10 µm deep.

8. A method of forming a device comprising:
   forming a trench in a substrate;
   filling the trench with a sacrificial material comprising a polymer matrix having dispersed therein micro-bubbles;
   planarizing said sacrificial material;
   forming at least one processing layer on a major surface of said substrate;
   removing material from an opposed major surface of said substrate to expose said sacrificial material in said trench; and
   removing said sacrificial material from said trench.

9. The method of claim 8 further comprising:
   forming at least one micro-electromechanical feature on said processing layer.

10. The method of claim 9 wherein said at least one micro-electromechanical has a reservoir feature that opens to said trench.

11. The method of claim 8 wherein said trench extends into said substrate to a depth of at least 10 µm.

12. The method of claim 8 wherein said sacrificial material comprises a photoresist material that has been subjected to a foaming agent.

13. The method of claim 8 wherein said processing layer is selected from the group consisting essentially of a dielectric, a conductor layer, a semiconductor, and combinations thereof.

14. The method of claim 8 wherein removing material from an opposed major surface of said substrate comprises a process step selected from the group consisting of lapping, grinding, polishing, etch back, chemical mechanical polishing, and combinations thereof.

15. A method for forming a device comprising:
   forming a trench within a workpiece;
   at least partially filling the trench with a sacrificial material, the sacrificial material comprising a foaming agent mixed with a matrix material to produce a dispersion of micro-bubbles within the matrix material;
   processing the workpiece to form a device therein; and
   removing the sacrificial material from within the trench.

16. The method of claim 15 wherein during the step of processing the workpiece, stress is imparted upon the workpiece, wherein stress is at least partially alleviated by the micro-bubbles.

17. The method of claim 15 wherein the device is a MEMS device.

18. The method of claim 15 wherein the matrix material is a photoresist material.

19. The method of claim 15 further comprising baking the sacrificial material after the step of at least partially filling the trench with sacrificial material.

* * * * *

UNITED STATES PATENT AND TRADEMARK OFFICE
CERTIFICATE OF CORRECTION

PATENT NO. : 8,053,377 B2  
APPLICATION NO. : 12/892190  
DATED : November 8, 2011  
INVENTOR(S) : Tsai et al.

Page 1 of 1

It is certified that error appears in the above-identified patent and that said Letters Patent is hereby corrected as shown below:

In Col. 5, line 53, claim 1, insert a --,-- after "function group".
In Col. 6, line 29, claim 10, after "electromechanical" insert --feature--.

Signed and Sealed this  
Third Day of January, 2012

David J. Kappos  
*Director of the United States Patent and Trademark Office*